(12) United States Patent
Lienhart et al.

(10) Patent No.: US 9,196,772 B2
(45) Date of Patent: Nov. 24, 2015

(54) LAYERED ELEMENT AND PHOTOVOLTAIC DEVICE COMPRISING SUCH AN ELEMENT

(75) Inventors: Fabien Lienhart, Paris (FR); Emilie Steers, Saint Denis (FR); Erwan Mahe, Saint Denis (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 258 days.

(21) Appl. No.: 13/132,045

(22) PCT Filed: Dec. 3, 2009

(86) PCT No.: PCT/FR2009/052405
§ 371 (c)(1),
(2), (4) Date: May 31, 2011

(87) PCT Pub. No.: WO2010/063974
PCT Pub. Date: Jun. 10, 2010

(65) Prior Publication Data
US 2011/0232749 A1 Sep. 29, 2011

(30) Foreign Application Priority Data
Dec. 3, 2008 (FR) .................................... 08 58242

(51) Int. Cl.
*H01L 31/00* (2006.01)
*H01L 31/048* (2014.01)
*G02B 1/115* (2015.01)
*H01L 31/0216* (2014.01)
(Continued)

(52) U.S. Cl.
CPC .............. *H01L 31/048* (2013.01); *G02B 1/115* (2013.01); *H01L 31/0296* (2013.01); *H01L 31/02165* (2013.01); *H01L 31/02168* (2013.01); *H01L 31/0322* (2013.01); *H01L 31/03685* (2013.01); *H01L 31/03762* (2013.01); *Y02B 10/12* (2013.01); *Y02E 10/52* (2013.01); *Y02E 10/541* (2013.01); *Y02E 10/545* (2013.01); *Y02E 10/548* (2013.01)

(58) Field of Classification Search
CPC ................. H01L 31/022483; H01L 31/02165; H01L 31/02168; H01L 31/022466; H01L 31/022475; H01L 31/022486; H01L 31/022491
USPC ........................................................ 136/256
See application file for complete search history.

(56) References Cited

U.S. PATENT DOCUMENTS

| 3,912,540 A | 10/1975 | Broder |
| 3,996,067 A | 12/1976 | Broder |

(Continued)

FOREIGN PATENT DOCUMENTS

| DE | 19707280 A1 * | 8/1998 |
| WO | 86 03885 | 7/1986 |

OTHER PUBLICATIONS

International Search Report issued May 20, 2010 in PCT/FR09/052405 filed Dec. 3, 2009.

*Primary Examiner* — Eli Mekhlin
(74) *Attorney, Agent, or Firm* — Oblon, McClelland, Maier & Neustadt, L.L.P.

(57) ABSTRACT

This layered element, in particular for a photovoltaic device, includes a polymer layer, a moisture-sensitive layer, and a protective coating forming a moisture barrier inserted between the polymer layer and the moisture-sensitive layer. The protective coating includes an antireflection multilayer comprising at least two thin layers differing in refractive index from each other.

15 Claims, 2 Drawing Sheets (51) Int. Cl.
  *H01L 31/0296* (2006.01)
  *H01L 31/032* (2006.01)
  *H01L 31/0368* (2006.01)
  *H01L 31/0376* (2006.01)

(56) References Cited

U.S. PATENT DOCUMENTS

| | | | | |
|---|---|---|---|---|
| 4,419,533 | A * | 12/1983 | Czubatyj et al. | 136/259 |
| 5,990,560 | A * | 11/1999 | Coult et al. | 257/772 |
| 6,086,777 | A * | 7/2000 | Cheng et al. | 216/67 |
| 6,153,823 | A * | 11/2000 | Shiozaki et al. | 136/249 |
| 6,259,016 | B1 * | 7/2001 | Negami et al. | 136/265 |
| 2003/0175557 | A1 * | 9/2003 | Anderson et al. | 428/698 |
| 2004/0063320 | A1 * | 4/2004 | Hollars | 438/689 |
| 2005/0224108 | A1 * | 10/2005 | Cheung | 136/251 |
| 2006/0165963 | A1 * | 7/2006 | Fleury et al. | 428/212 |
| 2006/0196535 | A1 * | 9/2006 | Swanson et al. | 136/244 |
| 2006/0197096 | A1 | 9/2006 | Kerdiles et al. | |
| 2007/0178316 | A1 * | 8/2007 | Mellott | 428/426 |
| 2008/0236650 | A1 * | 10/2008 | Gibson et al. | 136/244 |
| 2008/0308147 | A1 * | 12/2008 | Lu et al. | 136/256 |

* cited by examiner

LAYERED ELEMENT AND PHOTOVOLTAIC DEVICE COMPRISING SUCH AN ELEMENT

CROSS REFERENCE TO RELATED APPLICATIONS

The present application is the national stage of international application PCT/FR2009/052405, filed on Dec. 3, 2009, published as WO 2010/063974 on Jun. 10, 2010, the text of which is incorporated by reference, and claims the benefit of the filing date of French Application No. 00858242, filed on Dec. 3, 2008, the text of which is also incorporated by reference.

The present invention relates to a layered element, in particular for a photovoltaic device. The invention also relates to a photovoltaic device comprising such a layered element and to a process for manufacturing such a layered element.

Within the context of the invention, a photovoltaic device denotes a photovoltaic cell or a photovoltaic module.

As is known, a thin-film photovoltaic solar cell includes a layer of an absorber material suitable for converting light energy into electrical energy, which is inserted between two electrically conductive layers forming, respectively, a front electrode, intended to be placed on the side on which the light is incident on the cell, and a rear electrode. The absorber layer may in particular be a thin layer of a chalcopyrite compound comprising copper, indium and selenium, known as a CIS absorber layer, optionally with the addition of gallium (CIGS absorber layer), aluminum or sulfur. As a variant, the absorber layer may be a thin layer based on either amorphous or microcrystalline silicon, or based on cadmium telluride.

The front electrode of a thin-film photovoltaic cell may be based on a layer of a transparent conductive oxide (TCO), for example a layer of doped zinc oxide, especially aluminum-doped zinc oxide (AZO) or boron-doped zinc oxide, or based on a transparent metallic layer (TCC, for transparent conductive coating). It is known that the properties of such a layer forming the front electrode of a photovoltaic cell are, for certain layer compositions and in particular for a layer comprising zinc oxide, liable to be degraded due to the effect of moisture.

The front electrode of a thin-film photovoltaic cell is conventionally combined, on the side on which the light is incident on the cell, with a substrate having a glazing function, or front substrate, which may be composed of a transparent glass or of a transparent thermoplastic polymer, such as polyethylene, particularly polytetrafluoroethylene (PTFE), polyimide, polycarbonate, polyurethane or polymethyl methacrylate. In the case of a photovoltaic cell that includes an absorber layer based on a chalcopyrite compound and a glass front substrate, a transparent polymer lamination interlayer is positioned between the front electrode and the front substrate so as to guarantee a good cohesion of the cell during its assembly, especially by lamination. It has however been observed that, when a thin-film photovoltaic cell includes a polymer lamination interlayer or a polymer substrate positioned on a moisture-sensitive layer forming the front electrode of the cell, in particular a layer based on zinc oxide, the cell exhibits a high degree of degradation due to the effect of moisture. This is because the presence of the lamination interlayer, which tends to store moisture, or of the polymer substrate, which is permeable to moisture, promotes the migration of moisture toward the moisture-sensitive layer forming the front electrode, and therefore the impairment of the properties of this layer.

WO-A-97/36334 discloses a thin-film photovoltaic cell in which a moisture barrier layer is inserted between a zinc-oxide-based layer forming the front electrode of the cell and a polymer lamination interlayer surmounting the electrode. Such a barrier layer helps to limit the migration of moisture from the polymer lamination interlayer toward the zinc-oxide-based layer forming the front electrode. However, owing to the presence of this barrier layer, the light transmission at the interface between the polymer lamination interlayer and the layer forming the front electrode, which transmission is already limited because of a large difference in refractive index between the lamination interlayer and the zinc-oxide-based layer, is liable to be degraded. As a result, there is a risk of reducing the light flux reaching the absorber layer of the photovoltaic cell and therefore a risk of reducing the photovoltaic efficiency of the cell.

It is these drawbacks that the invention intends more particularly to remedy by proposing a layered element which, when it is integrated into a thin-film photovoltaic device, gives this device improved moisture resistance, without reducing the photovoltaic efficiency of the photovoltaic device, or even with an increase in this photovoltaic efficiency.

For this purpose, one subject of the invention is a layered element, in particular for a photovoltaic device, comprising a polymer layer, a moisture-sensitive layer and a protective coating forming a moisture barrier inserted between the polymer layer and the moisture-sensitive layer, characterized in that the protective coating consists of an antireflection multilayer (or stack) comprising at least two thin layers differing in refractive index from each other.

Within the meaning of the invention, an antireflection multilayer is a multilayer which ensures that a transmission, through the layered element, of radiation incident on the layered element on the polymer layer side, is equal to or greater than the transmission of this radiation obtained in the absence of the antireflection multilayer. Within the context of the invention, the expression "thin layer" is also understood to mean a layer having a thickness of less than 1 micrometer.

Throughout this description, the numerical values of refractive indices are given at 550 nm under illuminant D65 according to the DIN 67507 standard.

According to other advantageous features of a layered element according to the invention:
- the geometric thickness of each thin layer of the antireflection multilayer of the protective coating is adapted to maximize the transmission of radiation through the layered element;
- each thin layer of the antireflection multilayer of the protective coating is an oxide and/or nitride layer;
- the protective coating consists of an antireflection multilayer comprising at least three thin layers, the refractive index of one thin layer of each pair of successive thin layers of the antireflection multilayer being different from the refractive index of the other thin layer of the pair;
- the antireflection multilayer of the protective coating comprises, in succession, going from the moisture-sensitive layer toward the polymer layer, at least two thin layers of alternately lower and higher refractive indices with respect to each other;
- the antireflection multilayer of the protective coating comprises, in succession from the moisture-sensitive layer toward the polymer layer:
  a first layer having a first refractive index of between 1.3 and 1.7 at 550 nm and a first geometric thickness of between 15 and 35 nm, preferably between 20 and 30 nm, a second layer having a second refractive index of between 1.8 and 2.3 at 550 nm and a second geometric thickness of between 20 and 35 nm, preferably between 25 and 30 nm,
a third layer having a third refractive index of between 1.3 and 1.7 at 550 nm and a third geometric thickness of between 5 and 20 nm, preferably between 7 and 18 nm,
a fourth layer having a fourth refractive index of between 1.8 and 2.3 at 550 nm and a fourth geometric thickness of between 5 and 20 nm, preferably between 7 and 18 nm;
the antireflection multilayer of the protective coating comprises the following sequence of thin layers, from the moisture-sensitive layer toward the polymer layer: $SiO_2/Si_3N_4/SiO_2/Si_3N_4$;
the antireflection multilayer of the protective coating comprises, in succession, at least two thin layers decreasing in refractive index from the layer closest to the moisture-sensitive layer toward the layer closest to the polymer layer;
the antireflection multilayer of the protective coating comprises, in succession, at least two thin $SiO_xN_y$ layers decreasing in refractive index from the layer closest to the moisture-sensitive layer toward the layer closest to the polymer layer.

Another subject of the invention is a thin-film photovoltaic device comprising a layered element as described above and a layer of absorber material positioned on the moisture-sensitive layer side of the layered element.

Advantageously, in such a photovoltaic device, the geometric thickness of each thin layer of the protective coating is designed to maximize the transmission, weighted over the solar spectrum and the absorption spectrum of the absorber material of the device, through the layered element and toward the layer of absorber material, of radiation incident on the device on the polymer layer side.

According to a first variant of such a photovoltaic device, the device includes a substrate having a glazing function made of a transparent glass, the polymer layer being a transparent polymer lamination interlayer for bonding to the substrate. According to another variant, the polymer layer is a substrate of the photovoltaic device having a glazing function, which substrate is made of a transparent thermoplastic polymer. Within the meaning of the invention, the term "transparent" denotes transparency at least in the wavelength ranges of use for the photovoltaic device.

Another subject of the invention is a process for manufacturing a layered element as described above, in which at least some of the thin layers of the antireflection multilayer of the protective coating are deposited by sputtering and/or by Plasma Enhanced Chemical Vapor Deposition (PECVD).

The features and advantages of the invention will become apparent in the following description of two embodiments of a layered element and of a photovoltaic cell according to the invention, given solely by way of example and made with reference to the appended drawings in which.

Figure 1:
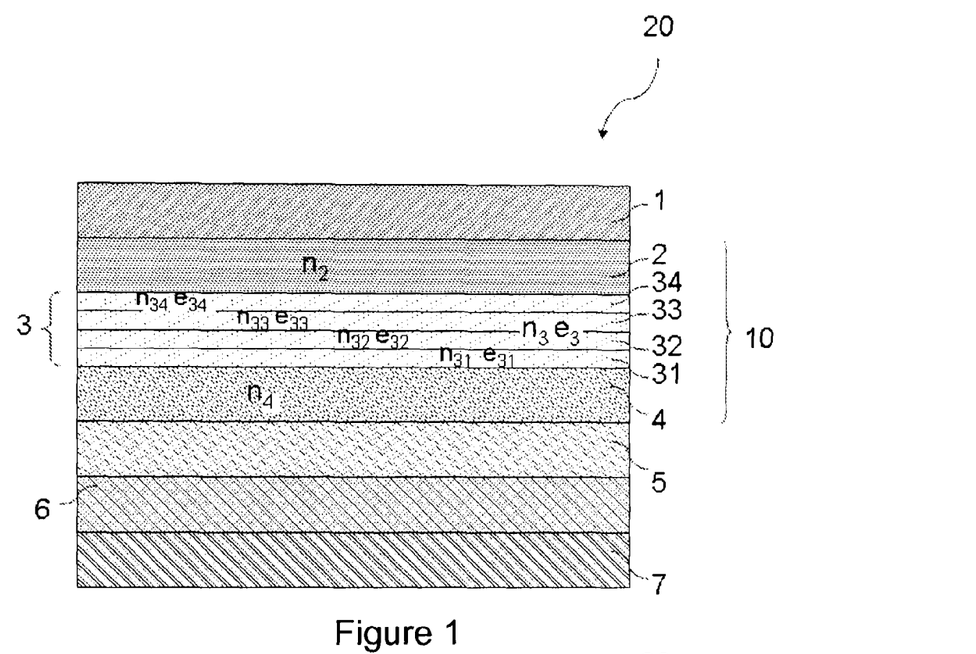
FIG. 1 is a schematic cross section of a photovoltaic solar cell according to a first exemplary embodiment of the invention.

The photovoltaic solar cell 20 according to the invention, shown in FIG. 1, is a thin-film cell comprising a front substrate 1 having a glazing function and a rear substrate 7 having a supporting function, between which a multilayer composed of layers 2, 3, 4, 5, 6 is placed.

The front substrate 1, intended to be placed on the side on which the light is incident on the cell 20, is composed of an extra-clear transparent glass having a very low content of iron oxides. Examples of such extra-clear glasses comprise in particular the glass "DIAMANT®" or the glass "ALBARINO"® sold by the company Saint-Gobain Glass.

The rear substrate 7 is composed of any suitable material, whether transparent or not, in particular composed of glass, and bears, on its face directed toward the interior of the cell 20, i.e. on the side on which light is incident on the cell 20, an electrically conductive layer 6 that forms a rear electrode of the cell 20. By way of example, the layer 6 is based on molybdenum.

Figure 2:
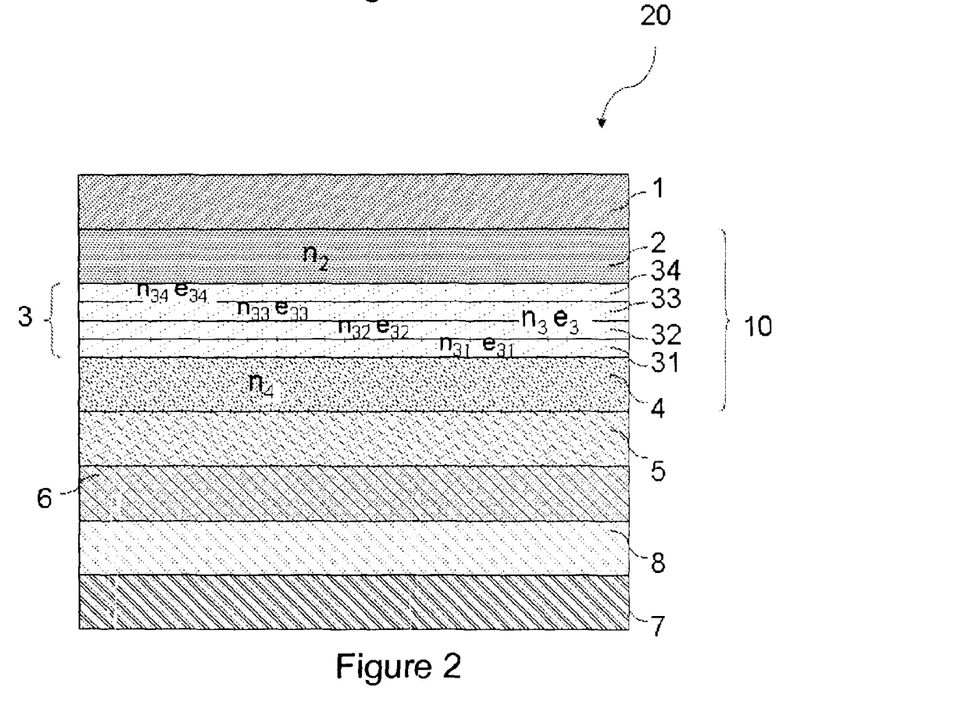
FIG. 2 is a cross section similar to FIG. 1 of a variant of the photovoltaic solar cell of FIG. 1.

In the variant of the cell 20 shown in FIG. 2, the rear substrate 7 is composed of glass and an alkali barrier layer 8 is inserted between the rear substrate 7 and the molybdenum layer 6 forming the rear electrode. This alkali barrier layer 8 is deposited, prior to deposition of the layer 6, over all or part of that face of the rear substrate 7 which is directed toward the interior of the cell 20, for example by magnetron sputtering of the sputter down or sputter up type or by a CVD process, such as PECVD (Plasma Enhanced Chemical Vapor Deposition). The alkali barrier layer 8 comprises a dielectric material based on silicon nitride, oxide or oxynitride or aluminum nitride, oxide or oxynitride, or else based on titanium nitride or zirconium nitride, where they are used by themselves or as a mixture. The geometric thickness of the layer 8 is between 3 and 200 nm, preferably between 20 and 150 nm. By way of example, the alkali barrier layer 8 may be based on $Si_3N_4$.

The layer 6 forming the rear electrode is surmounted, in a conventional manner, by an absorber layer 5 based on a chalcopyrite compound, especially CIS or CIGS, suitable for ensuring the conversion of solar energy to electrical energy. The absorber layer 5 is itself surmounted by a cadmium sulfide (CdS) layer, not shown in the figures and optionally combined with an undoped intrinsic ZnO layer, also not shown, and then by an electrically conductive layer 4 that forms a front electrode of the cell 20. The layer 4 is a layer based on aluminum-doped zinc oxide (AZO). As a variant and by way of nonlimiting examples, the layer 4 may be a layer based on boron-doped zinc oxide, a layer based on another moisture-sensitive doped transparent conductive oxide, or a moisture-sensitive transparent metallic layer, such as a silver-based multilayer.

With a view to protecting the AZO layer 4, which is a moisture-sensitive layer, the cell 20 further includes a moisture-resistant protective coating 3 arranged on the layer 4. In addition, a transparent polymer lamination interlayer 2 is positioned between the protective coating 3 and the front substrate 1, so as to ensure that the functional layers of the cell 20 are held between the front substrate 1 and the rear substrate 7. The lamination interlayer 2 is a thermosetting polymer layer, for example a layer of polyvinyl butyral (PVB). As a variant and by way of example, the lamination interlayer 2 may also be composed of ethylene vinyl acetate (EVA). The assembly comprising the superposed layer 4, coating 3 and lamination interlayer 2 forms a layered element 10.

In accordance with the invention, the protective coating 3 of the layered element 10 is a coating consisting of an antireflection multilayer of at least two transparent thin layers differing in refractive index from each other.

In particular in the example shown in FIG. 1, the coating 3 is a quadrilayer coating comprising four transparent thin layers 31, 32, 33, 34 of alternately lower and higher refractive indices one with respect to each other. More precisely, the stack of thin layers of the coating 3 comprises, in succession from the AZO layer 4 forming the front electrode of the cell 20 toward the PVB lamination interlayer 2:

an $SiO_2$ first layer 31 having a refractive index $n_{31}$ of 1.45-1.48 and a geometric thickness $e_{31}$ of between 15 and 35 nm, preferably between 20 and 30 nm;

an $Si_3N_4$ second layer 32 having a refractive index $n_{32}$ of 1.95-2.05 and a geometric thickness $e_{32}$ of between 20 and 35 nm, preferably between 25 and 30 nm;

an $SiO_2$ third layer 33 having a refractive index $n_{33}=n_{31}$ of 1.45-1.48 and a geometric thickness $e_{33}$ of between 5 and 20 nm, preferably between 7 and 18 nm; and an $Si_3N_4$ fourth layer 34 having a refractive index $n_{34}=n_{32}$ of 1.95-2.05 and a geometric thickness $e_{34}$ of between 5 and 20 nm, preferably between 7 and 18 nm.

As a variant, the $SiO_2$ third layer 33 of the coating 3 may have a geometric thickness $e_{33}$ of between 35 and 55 nm, preferably between 40 and 50 nm.

In another example (not shown) of the invention, the coating 3 may be a bilayer coating consisting of two transparent thin layers, namely, from the AZO layer 4 toward the PVB lamination interlayer 2, a thin $SiO_2$ layer, having a refractive index of 1.45-1.48 and a geometric thickness of between 15 and 35 nm, preferably between 20 and 30 nm, and a thin $Si_3N_4$ layer having a refractive index of 1.95-2.05 and a geometric thickness of between 10 and 30 nm, preferably between 15 and 25 nm.

As a variant, in the aforementioned examples, one or each thin layer of higher refractive index of the coating 3 may be, instead of an $Si_3N_4$ layer, a layer based on SiN, SnZnSbO, $SnO_2$, ZnO, AlN, NbO, $TiO_2$, TiZnO, SiTiO or TiON.

In addition, in the aforementioned examples, one or each thin layer of lower refractive index of the coating 3 may be, instead of an $SiO_2$ layer, a layer based on $Al_2O_3$, $MgF_2$, $AlF_3$ or $Y_2O_3$.

An advantageous process for manufacturing a layered element according to the invention comprises the deposition of the multilayer protective coating by a vacuum technique, in particular by magnetron sputtering or by corona discharge. In this process, the various layers of the protective coating are successively deposited cold, for example on the AZO layer deposited beforehand.

In particular, the quadrilayer and bilayer protective coatings 3 described above, which comprise an alternating stack of $SiO_2$ and $Si_3N_4$ layers, may be deposited by sputtering using a silicon target lightly doped with a metal, such as aluminum, so as to render it sufficiently conductive.

In the case of a protective coating comprising layers based on metal nitrides or oxides, these layers may be deposited by reactive sputtering of the metal in question, in the presence of nitrogen or in the presence of oxygen respectively, in an argon plasma. In addition, in the case of layers based on antimony-doped mixed zinc tin oxides, these layers may be deposited by a cosputtering process using zinc and tin targets respectively, in the presence of oxygen, or by a sputtering process using a target based on the desired mixture of tin and zinc, again in the presence of oxygen.

Another advantageous process for manufacturing a layered element according to the invention comprises the deposition of the multilayer protective coating by Plasma Enhanced Chemical Vapor Deposition (PECVD). This reduced-pressure deposition technique uses the decomposition of precursors under the effect of a plasma, in particular under the effect of collisions between the excited or ionized species of the plasma and the molecules of the precursor. Particularly advantageously, a PECVD-deposited coating is a conformal coating, i.e. the coating follows the reliefs of the deposition surface, so that there is no shadowing effect if the coating is deposited on a surface having an irregular relief. A coating deposited by PECVD would therefore be preferred to a coating deposited by sputtering if the deposition surface of the protective coating is irregular, so as to avoid any shadowing effect, and especially when the protective coating is deposited after the steps of etching the solar cell.

Using PECVD, it is possible to deposit multilayer coatings having alternating refractive indices and multilayer coatings having a stepped gradient of refractive indices.

More precisely, the PECVD technique makes it possible to deposit successive thin layers of different, in particular alternate, chemical natures by modifying the nature of the precursors during the deposition. The introduction of different precursors during one phase of the deposition makes it possible to obtain a zone of different chemical nature within a layer, and therefore to form multilayer coatings in which the constituent thin layers are of different chemical compositions.

The PECVD technique also makes it possible to very easily obtain a variation in the stoichiometry of a layer, via modification of one or more quantities, especially the relative proportions of the precursors. It is therefore possible to form multilayer coatings, the constituent thin layers of which are of the same chemical nature but have different stoichiometries.

Other deposition techniques are possible, but are less preferred, in particular evaporation techniques, or atmospheric pressure PECVD processes, in particular those using dielectric barrier discharge technologies.

Table 1 below shows the results of tests for evaluating the performance as moisture barriers of protective coatings 3 having different compositions, comprising coatings 3 having a single $SiO_2$ or $Si_3N_4$ layer, and also the quadrilayer and bilayer coatings 3 described above by way of examples.

These performance tests were carried out by producing several samples, obtained by depositing the various protective coatings 3 on glass/aluminum systems, and then by placing each of the samples in a chamber having a temperature of between 85° C. and 95° C. and a relative humidity of 95% for 311 hours, after which the surface condition of the aluminum support of each sample was observed. The surface condition of the aluminum support after the test is considered to be satisfactory (OK) when no major visual defect is detected.

TABLE 1

| Protective coating 3 (stack starting from the aluminum support) | Surface condition of the aluminum support after the test |
| --- | --- |
| None | Not OK |
| $SiO_2$ (100 nm) | OK |
| $Si_3N_4$ (100 nm) | Not OK |
| $SiO_2$ (20 nm)/$Si_3N_4$ (22 nm) | OK |
| $SiO_2$ (21 nm)/$Si_3N_4$ (27 nm)/ $SiO_2$ (12 nm)/$Si_3N_4$ (10 nm) | OK |

It is apparent from Table 1 that the quadrilayer protective coating 3 of the layered element 10 shown in FIG. 1 provides effective protection of the aluminum support against moisture, in particular more effective protection than an $Si_3N_4$ monolayer protective coating and at least as effective protection as an $SiO_2$ monolayer protective coating, for an overall geometric thickness $e_3$ of the protective coating of less than 100 nm.

Likewise, a bilayer protective coating 3 as described above, comprising a successive stack of a thin $SiO_2$ layer having a geometric thickness of 20 nm and a thin $Si_3N_4$ layer having a geometric thickness of 22 nm, constitutes an effective moisture barrier. In particular, this bilayer coating having an overall geometric thickness $e_3$ of 42 nm is at least as effective, as moisture barrier, as an $SiO_2$ monolayer protective coating having an overall geometric thickness $e_3$ of 100 nm.

Within the context of the layered element 10 according to the invention, it is therefore apparent that a multilayer protective coating 3, in particular a quadrilayer or bilayer protective coating as described above, constitutes an effective barrier against the migration of moisture from the PVB lamination interlayer 2, which tends to store moisture, toward the moisture-sensitive layer 4. The effectiveness of such a multilayer coating 3 as a moisture barrier is even overall better than that obtained with a monolayer protective coating for the same overall geometric thickness $e_3$ of the coating. This is because the presence of a multiplicity of interfaces within the multilayer coating 3, which in the examples described above results from the alternating $SiO_2$ layers and $Si_3N_4$ layers in such a way that the adjacent layers of the coating 3 differ in nature, lengthens the path necessary for the water molecules stored in the lamination interlayer 2 to reach the moisture-sensitive layer 4.

The variation of the transmission, through the layered element 10 according to the invention, of radiation incident on the front substrate 1 was also evaluated, on the one hand, in the absence of a protective coating 3 and, on the other hand, in the presence of a protective coating 3 inserted between the PVB lamination interlayer 2 and the AZO layer 4 of the element 10, for the various coating compositions envisaged above in Table 1. The results of this analysis, carried out with a 0.78 mm geometric thickness of the PVB lamination interlayer 2 and a 1200 nm geometric thickness of the AZO layer 4, are compiled in Table 2 below. The light transmission through the layered element 10 was weighted over the solar spectrum, which may in particular be determined as an average of the solar spectra corresponding to the various angles of incidence obtained during one day, for a photovoltaic device used at a given latitude, and over the absorption spectrum of the absorber of the layer 5, which in this example was a CIS absorber layer, so as to estimate the light flux that can actually be used by the absorber layer 5 of the cell 20 for photovoltaic conversion. For each composition of the protective coating 3, the change in this weighted transmission, denoted by TSQE (CIS), relative to that of a layered element not having any protective coating inserted between the PVB lamination interlayer 2 and the AZO layer 4, is also indicated.

TABLE 2

| Protective coating 3 (stack starting from the AZO layer 4 toward the PVB layer 2) | Weighted transmission TSQE(CIS) through the element 10 | Change |
| --- | --- | --- |
| None | 76.4% | — |
| $SiO_2$ (100 nm) | 76.4% | 0.0% |
| $Si_3N_4$ (100 nm) | 74.6% | −1.8% |
| $SiO_2$ (20 nm)/$Si_3N_4$ (22 nm) | 77.0% | +0.6% |
| $SiO_2$ (21 nm)/$Si_3N_4$ (27 nm)/ $SiO_2$ (12 nm)/$Si_3N_4$ (10 nm) | 77.1% | +0.7% |

It is apparent from Table 2 that a multilayer protective coating 3, in particular a quadrilayer or bilayer protective coating as described above by way of example, makes it possible to obtain a weighted transmission TSQE(CIS) through the layered element 10 which is higher than the weighted transmission TSQE(CIS) obtained in the absence of this protective coating. This is because the multilayer, in particular quadrilayer or bilayer, protective coating 3 of an element 10 according to the invention is designed in such a way that the refractive indices of the layers are alternately lower and higher with respect to each other going from the layer 4 toward the lamination interlayer 2. Consequently, for suitable geometric thicknesses of the layers of the coating, the multilayer protective coating 3 of an element 10 according to the invention constitutes an interference filter and provides an antireflection function at the interface between the PVB lamination interlayer 2 and the AZO layer 4. Suitable values of the geometric thicknesses of the layers of the protective coating may in particular be selected using optimization software.

As a result, the light flux useful for the photovoltaic conversion that reaches the absorber layer 5 of the cell 20 according to the invention is higher than the useful light flux reaching the absorber layer of a similar thin-film photovoltaic cell of the prior art containing no multilayer protective coating. A multilayer protective coating 3, inserted between the polymer lamination interlayer 2 and the layer 4 of the layered element 10 according to the invention, thus makes it possible to increase the photovoltaic efficiency of the cell 20 compared with the efficiency obtained in the absence of the multilayer protective coating.

Figure 3:
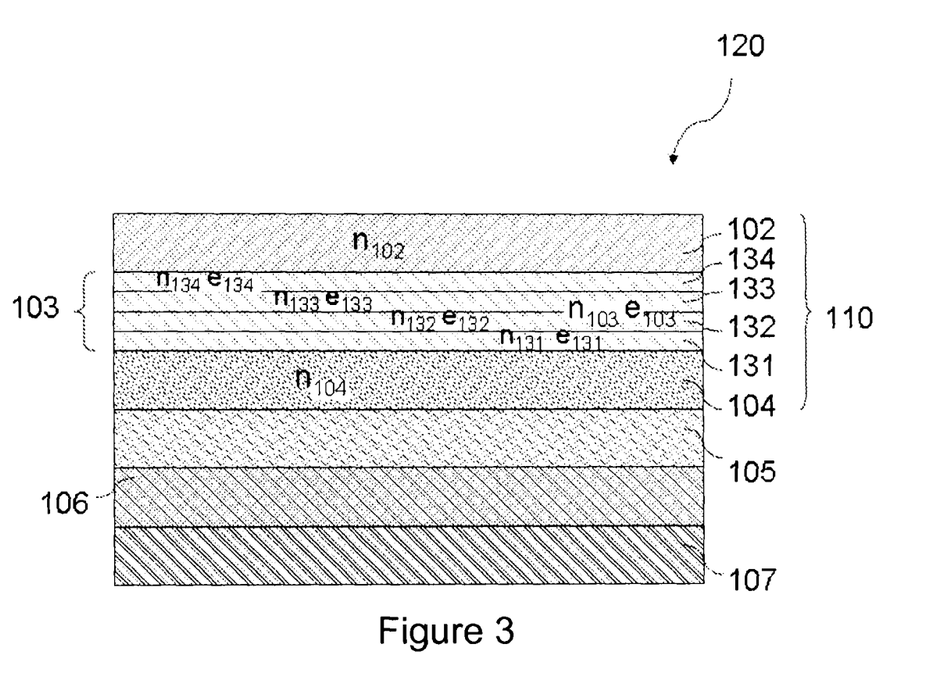
FIG. 3 is a cross section similar to FIG. 1 for a photovoltaic solar cell according to a second exemplary embodiment of the invention.

In the second embodiment shown in FIG. 3, the elements analogous to those of the first embodiment bear identical references increased by 100. The photovoltaic cell 120 according to this second embodiment differs from the cell 20 of the first embodiment in particular in that it comprises a front substrate 102 composed of a transparent thermoplastic polymer and not of glass. The cell 120 also includes a rear substrate 107 that bears, on its face directed toward the interior of the cell 120, an electrically conductive layer 106 forming a rear electrode of the cell 120.

The layer 106 is surmounted by a layer 105 of absorber material suitable for ensuring the conversion of solar energy into electrical energy. In this second embodiment, the layer 105 may be chosen to be a thin CIS absorber layer, a thin layer based on silicon or a thin layer based on cadmium telluride. As is known, in the case in which the layer 105 is a thin CIS absorber layer, the cell 120 is fabricated in substrate mode, i.e. by successively depositing the constituent layers of the cell on the rear substrate 107. In contrast, if the layer 105 is a thin layer based on silicon or a thin layer based on cadmium telluride, the cell 120 is fabricated in superstrate mode, i.e. by successively depositing the constituent layers of the cell on the front substrate 102.

Analogously to the first embodiment, the absorber layer 105 is surmounted by an electrically conductive moisture-sensitive layer 104, based on aluminum-doped zinc oxide (AZO), which forms a front electrode of the cell 120. The cell 120 further includes a protective coating 103, which is inserted between the moisture-sensitive layer 104 and the front substrate 102 composed of a thermoplastic polymer. The transparent substrate 102, which may in particular be composed of polyethylene (for example polytetrafluoroethylene (PTFE)), polyimide, polycarbonate, polyurethane or polymethyl methacrylate, is, unlike a glass substrate, permeable to moisture. The assembly comprising the superposed layer 104, coating 103 and substrate 102 forms a layered element 110.

In accordance with the invention, the protective coating 103 of the layered element 110 is a coating consisting of an antireflection multilayer of at least two transparent thin layers. In particular, as shown in FIG. 3, the coating 103 is a quadrilayer coating comprising four transparent thin layers 131, 132, 133, 134 of alternately lower and higher refractive indices relative to one another, namely in succession, from the layer 104 toward the polymer substrate 102:

an $SiO_2$ first layer 131 having a refractive index $n_{131}$ of 1.45-1.48 and a geometric thickness $e_{131}$ of between 15 and 35 nm, preferably between 20 and 30 nm;

an $Si_3N_4$ second layer 132 having a refractive index $n_{132}$ of 1.95-2.05 and a geometric thickness $e_{132}$ of between 20 and 35 nm, preferably between 25 and 30 nm;

an $SiO_2$ third layer 133 having a refractive index $n_{133}=n_{131}$ of 1.45-1.48 and a geometric thickness $e_{133}$ of between 5 and 20 nm, preferably between 7 and 18 nm; and an $Si_3N_4$ fourth layer 134 having a refractive index $n_{134}=n_{132}$ of 1.95-2.05 and a geometric thickness $e_{134}$ of between 5 and 20 nm, preferably between 7 and 18 nm.

As a variant, analogously to the first embodiment, the $SiO_2$ third layer 133 of the coating 103 may have a geometric thickness $e_{133}$ of between 35 and 55 nm, preferably between 40 and 50 nm.

As in the first embodiment, the thin layers of the multilayer protective coating 103 inserted between the polymer substrate 102 and the moisture-sensitive layer 104 of the layered element 110 have refractive indices that are alternately lower and higher relative to one another, from the layer 104 toward the substrate 102. The multilayer coating 103 thus makes it possible, compared with what is obtained with a protective coating according to the prior art, both to improve the protection of the AZO layer 104 against the moisture that can pass into the cell 120 through the permeable polymer substrate 102, thanks to the multiplicity of interfaces between the various constituent layers of the coating 103, and to improve the useful light transmission through the element 110 toward the absorber layer 105, by an antireflection effect at the interface between the AZO layer 104 and the polymer substrate 102. As in the first embodiment, this results in an increase in the photovoltaic efficiency of the photovoltaic cell 120 incorporating the element 110 compared with photovoltaic cells according to the prior art that do not contain a multilayer protective coating.

The above examples illustrate the advantages of a layered element according to the invention, comprising a multilayer protective coating, which, when it is integrated into a thin-film photovoltaic cell, improves the moisture resistance and the photovoltaic efficiency of this cell.

More generally, these advantages may be obtained by means of a protective coating, inserted between the moisture-sensitive layer and the polymer layer of a layered element according to the invention, comprising an antireflection multilayer formed by at least two superposed layers of different refractive indices. An antireflection multilayer of the protective coating inserted between the moisture-sensitive layer and the polymer layer is a multilayer that ensures that the transmission of radiation through the layered element is equal to or greater than the transmission of said radiation obtained in the absence of the antireflection multilayer.

In particular, the various layers of the antireflection multilayer of the protective coating of a layered element according to the invention may be positioned in such a way that the refractive indices of the layers are alternately lower and higher relative to one another, as in the examples described above.

According to a variant (not shown) of the invention, the various layers of the antireflection multilayer of the protective coating of a layered element according to the invention may also be positioned in such a way that the refractive indices of the layers decrease from the layer closest to the moisture-sensitive layer toward the layer closest to the polymer layer. The multilayer protective coating therefore creates a stepped gradient of refractive indices decreasing from the moisture-sensitive layer, the refractive index of which is higher than that of the polymer layer, toward the polymer layer.

Such a multilayer coating having a stepped gradient of refractive indices may in particular be formed by a multilayer of successive $SiO_xN_y$ layers of refractive indices decreasing from the moisture-sensitive layer toward the polymer layer, the extreme layers being for example an $Si_3N_4$ layer near the moisture-sensitive layer and an $SiO_2$ layer near the polymer layer, respectively. The various $SiO_xN_y$ layers of decreasing refractive indices have relative proportions of nitrogen and oxygen that are different from one layer to another.

These layers may be successively deposited cold on the moisture-sensitive layer by sputtering, in an argon plasma, using a silicon target lightly doped with a metal so as to make it sufficiently conductive, and in the presence of nitrogen and/or oxygen. Advantageously, the successive $SiO_xN_y$ layers of decreasing refractive indices are then obtained by varying, in steps, the proportions of nitrogen and oxygen during the sputtering, in particular by reducing the proportion of nitrogen and increasing the proportion of oxygen.

As a variant, these layers may be deposited in succession by PECVD, the stoichiometry being modified between one thin layer and the next thin layer of the protective coating, especially by varying, in steps, the relative proportions of the precursors.

A multilayer coating having a stepped gradient of refractive indices makes it possible, in the same way as a multilayer coating having alternating refractive indices, both to improve the protection of the moisture-sensitive layer, thanks to the multiplicity of interfaces between the various constituent layers of the protective coating, and to improve the useful light transmission through the layered element incorporating the protective coating, by an antireflection effect at the interface between the moisture-sensitive layer and the polymer layer.

Irrespective of the mode of stacking the constituent layers of the protective coating, i.e. having alternating refractive indices or having a stepped gradient of refractive indices, the invention provides a doubly advantageous layered element in terms of moisture protection and in terms of light transmission. These two advantages have been obtained, on the one hand, by detecting the possibility of improving the moisture barrier effect of a protective coating thanks to the presence of a plurality of layers differing in nature within the coating and, on the other hand, by benefiting from the presence of this plurality of layers in order to position, at the interface between the polymer layer and the moisture-sensitive layer, an antireflection multilayer. The presence of such an antireflection multilayer at the interface between the lamination interlayer, or the polymer substrate, and the moisture-sensitive front electrode of a thin-film photovoltaic cell is all the more effective for improving the light transmission, and therefore the efficiency of the cell, since, owing to a large refractive index difference between the constituent materials of the lamination interlayer, or of the substrate, and of the front electrode, a significant loss of the light flux incident on the cell occurs at this interface by reflection.

The invention is not limited to the examples described and represented. In particular, as already mentioned, a layered element according to the invention may have a protective coating comprising any number, greater than or equal to two, of superposed layers, the chemical compositions and the thicknesses of these layers possibly being different from those described previously. In particular, the antireflection multilayer of the protective coating may comprise either an even number or an odd number of thin layers, the refractive index of a thin layer of each pair of successive thin layers of the antireflection multilayer being different from the refractive index of the other thin layer of the pair. For a given composition of the layers of the protective coating, the respective geometric thicknesses of the layers are advantageously selected, for example using optimization software, so as to maximize the weighted light transmission through the layered element.

Irrespective of the way in which the constituent layers of the protective coating are stacked, namely with alternating refractive indices or with a stepped gradient of refractive indices, a trilayer or quadrilayer multilayer is advantageous as it provides a satisfactory number of interfaces for the moisture barrier function. In the case of a protective coating having alternating refractive indices, a quadrilayer multilayer as shown in FIGS. 1, 2 and 3 is particularly advantageous insofar as it provides not only a satisfactory number of interfaces for the moisture barrier function, but also a satisfactory number of layers for the interference filter function of the protective coating.

Likewise, the polymer layer and the moisture-sensitive layer of a layered element according to the invention may differ in nature and in thickness from those described previously. In particular, the moisture-sensitive layer may be at least partly formed by a metallic layer. By way of example, in the case of a photovoltaic cell having an absorber layer based on a chalcopyrite compound and having a glass substrate, the moisture-sensitive layer may be partly formed by the molybdenum layer forming the rear electrode, if portions of this molybdenum layer are brought directly into contact with the polymer lamination interlayer by etching certain portions of the cell.

Moreover, a layered element according to the invention may be used in what is called a "tandem" photovoltaic cell in which the absorber layer is formed by a stack of several layers of different absorber materials. A layered element according to the invention may also be used in a photovoltaic cell having an organic absorber, the layer of organic absorber then forming, at least partly, the moisture-sensitive layer.

The invention claimed is:

1. A layered element, comprising:
a polymer layer;
a moisture-sensitive electrically conductive layer; and
a protective coating forming a moisture barrier inserted in direct contact with and positioned between the polymer layer and the moisture-sensitive electrically conductive layer,
wherein the protective coating is an antireflection multilayer ensuring antireflection at the interface between the polymer layer and the moisture-sensitive electrically conductive layer and comprising, in succession starting from the moisture-sensitive electrically conductive layer toward the polymer layer, at least four thin layers of alternately lower and higher refractive indices with respect to each other, which are:
a first layer having a first refractive index of between 1.3 and 1.7 at 550 nm and a first geometric thickness of between 15 and 35 nm in direct contact with the moisture-sensitive electrically conductive layer;
a second layer having a second refractive index of between 1.8 and 2.3 at 550 nm and a second geometric thickness of between 20 and 35 nm in direct contact with the first layer;
a third layer having a third refractive index of between 1.3 and 1.7 at 550 nm and a third geometric thickness of between 5 and 20 nm; and
a fourth layer having a fourth refractive index of between 1.8 and 2.3 at 550 nm and a fourth geometric thickness of between 5 and 20 nm.

2. The layered element of claim 1, wherein a geometric thickness of each thin layer of the antireflection multilayer of the protective coating is adapted to maximize the transmission of radiation through the layered element.

3. The layered element of claim 1, wherein each thin layer of the antireflection multilayer of the protective coating is at least one selected from the group consisting of an oxide layer and nitride layer.

4. The layered element of claim 1, wherein the antireflection multilayer of the protective coating comprises the following sequence of layers, from the moisture-sensitive layer toward the polymer layer:
$SiO_2/Si_3N_4/SiO_2/Si_3N_4$.

5. The layered element of claim 1, wherein the antireflection multilayer of the protective coating comprises, in succession, at least two thin $SiO_xN_y$ layers decreasing in refractive index from the layer closest to the moisture-sensitive layer toward the layer closest to the polymer layer.

6. A thin-film photovoltaic device, comprising:
the layered element of claim 1; and
a layer of absorber material positioned on a moisture-sensitive layer side of the layered element.

7. The device of claim 6, wherein the geometric thickness of each thin layer of the protective coating is adapted to maximize transmission of light, weighted over the solar spectrum and an absorption spectrum of an absorber material of the device, through the layered element and toward a layer of absorber material, of radiation incident on device on a polymer layer side.

8. The device of claim 6, further comprising;
a substrate comprising transparent glass,
wherein the polymer layer of the layered element is a polymer lamination interlayer that bonds the layered element to the substrate.

9. The device of claim 6, wherein the polymer layer of the layered element is a substrate of the device, and
wherein the polymer layer of the layered element comprises a transparent thermoplastic polymer.

10. A process for manufacturing the layered element of claim 1, comprising:
depositing at least some of the thin layers of the antireflection multilayer of the protective coating by at least one selected from the group consisting of sputtering and Plasma Enhanced Chemical Vapor Deposition (PECVD).

11. The layered element of claim 1, wherein the first layer has a first geometric thickness of between 20 and 30 nm.

12. The layered element of claim 1, wherein the second layer has a second geometric thickness of between 25 and 30 nm.

13. The layered element of claim 1, wherein the third layer has a third geometric thickness of between 7 and 18 nm.

14. The layered element of claim 1, wherein the fourth layer has a fourth geometric thickness of between 7 and 18 nm.

15. A layered element, comprising:
a polymer layer;
a moisture-sensitive electrically conductive layer; and
a protective coating forming a moisture barrier inserted in direct contact with and positioned between the polymer layer and the moisture-sensitive electrically conductive layer,
wherein the protective coating is an antireflection multilayer ensuring antireflection at the interface between the polymer layer and the moisture-sensitive electrically conductive layer and comprising, in succession starting from the moisture-sensitive electrically conductive layer toward the polymer layer:

a first layer of $SiO_2$ having a first refractive index of between 1.3 and 1.7 at 550 nm and a first geometric thickness of between 15 and 35 nm in direct contact with the moisture-sensitive electrically conductive layer;

a second layer of $Si_3N_4$ having a second refractive index of between 1.8 and 2.3 at 550 nm and a second geometric thickness of between 20 and 35 nm in direct contact with the first layer;

a third layer of $SiO_2$ having a third refractive index of between 1.3 and 1.7 at 550 nm and a third geometric thickness of between 5 and 20 nm; and a fourth layer of $Si_3N_4$ having a fourth refractive index of between 1.8 and 2.3 at 550 nm and a fourth geometric thickness of between 5 and 20 nm.

* * * * *